United States Patent [19]

Hughes

[11] Patent Number: 5,055,719

[45] Date of Patent: Oct. 8, 1991

[54] CURRENT CONVEYOR CIRCUIT

[75] Inventor: John B. Hughes, Hove, England

[73] Assignee: U.S. Philips Corporation, New York, N.Y.

[21] Appl. No.: 479,304

[22] Filed: Feb. 13, 1990

[30] Foreign Application Priority Data

Feb. 17, 1989 [GB] United Kingdom ................ 8903705

[51] Int. Cl.⁵ ........................ H03K 3/013; H03K 5/00
[52] U.S. Cl. .................................. 307/491; 307/296.8; 307/270; 330/288
[58] Field of Search .................. 307/296.1, 296.8, 491, 307/562, 568, 572, 270; 330/288

[56] References Cited

U.S. PATENT DOCUMENTS

| | | | |
|---|---|---|---|
| 4,450,366 | 5/1984 | Malhi et al. | 330/288 |
| 4,471,292 | 9/1984 | Schenck et al. | 330/288 |
| 4,879,520 | 11/1989 | Cotreau | 307/296.1 |

Primary Examiner—John Zazworsky
Attorney, Agent, or Firm—Bernard Franzblau

[57] ABSTRACT

A second generation current conveyor circuit for accepting a current at an input (100) at a low impedance and for providing an output current of the same or a related value at an output (101) at a high impedance. The circuit includes a first transistor (T101) connected in series with second diode connected transistor (T102) between the input and a first voltage supply line. A third transistor (T103) is connected in series with a fourth diode connected transistor (T104) between the first voltage supply line and an input terminal (102) for the application of a reference potential. A fifth transistor (T105) has a control electrode connected to the control electrodes of the second and third transistors and is connected between the first supply voltage line and the output. The control electrodes of the first and fourth transistors are connected in common. A cancelling current is internally generated for cancelling the current through the fourth transistor so that no current is drawn through the input terminal. The cancelling current is internally generated by a sixth transistor (T106) having a control electrode connected to the control electrode of the second transistor (T102) a current mirror circuit (T107, T108) feeds the cancelling current to the fourth transistor.

10 Claims, 1 Drawing Sheet

CURRENT CONVEYOR CIRCUIT

BACKGROUND OF THE INVENTION

This invention relates to a current conveyor circuit for accepting a current at an input at a low impedance and providing an output current of the same or a related value at an output at a high impedance comprising, a first transistor whose main current conducting path is connected between the input and a second diode connected transistor whose other end is connected to a voltage supply, a third transistor whose main current carrying path is connected between the voltage supply and a fourth diode connected transistor whose other end is connected to an input terminal for the application of a reference potential, and a fifth transistor whose control electrode is connected to the control electrodes of the second and third transistors and whose main current conducting path is connected between the supply voltage and the output, wherein the control electrodes of the first and fourth transistors are commoned.

A current conveyor circuit as set forth in the preceding paragraph is described in U.S. Pat. No. 3,582,689 and is generally known as a first generation current conveyor circuit or CC1. This circuit has the disadvantage that the input to which the reference voltage is applied takes the same current as the input current and consequently it is difficult to hold the reference voltage constant and hence the input impedance at the current input may rise. A second generation current conveyor circuit or CC2 is known but is generally formed using operational amplifiers. This adds complexity to the circuit and may require high supply voltages.

SUMMARY OF THE INVENTION

It is an object of the invention to provide a comparatively simple current conveyor circuit having a low impedance at its current input.

The invention provides a current conveyor circuit as set forth in the opening paragraph characterised in that means are provided for internally generating a cancelling current for cancelling the current through the fourth transistor so that substantially no current is drawn through the input terminal.

The means for internally generating the cancelling current may comprise a sixth transistor whose control electrode is connected to the control electrode of the second transistor and which is connected to produce the cancelling current, and means for feeding the cancelling current to the fourth transistor.

The means for feeding the cancelling current may comprise a current mirror circuit. The transistors may be field effect transistors.

Current conveyor circuits are circuits in which current is conveyed between two ports at greatly different impedance levels. The current conveyor is a three port network with three ports which can be denoted x, y, and z. Its terminal characteristics can be represented by a hybrid matrix giving the outputs of the three ports in terms of their corresponding inputs. For a first generation current conveyor (CC1), this relationship is:

$$\begin{pmatrix} i_y \\ v_x \\ i_z \end{pmatrix} = \begin{pmatrix} 0 & 1 & 0 \\ 1 & 0 & 0 \\ 0 & \pm 1 & 0 \end{pmatrix} \begin{pmatrix} v_y \\ i_x \\ v_z \end{pmatrix}$$

For a second generation current conveyor (CC2) this relationship is:

$$\begin{pmatrix} i_y \\ v_x \\ i_z \end{pmatrix} = \begin{pmatrix} 0 & 0 & 0 \\ 1 & 0 & 0 \\ 0 & \pm 1 & 0 \end{pmatrix} \begin{pmatrix} v_y \\ i_x \\ v_z \end{pmatrix}$$

Further information concerning current conveyors and their implementation can be obtained by reference to the paper entitled "Current Conveyors: A Review of the State of the Art" by Umesh Kumar, published in IEEE Circuits and Systems Magazine Vol. 3, No. 1, 1981, pages 10 to 14 and in the references cited therein. As discussed in that publication, the transfer characteristic between ports x and z is that of a current controlled current source with a virtual short circuit at input x. The output impedance at port z can be made very high by techniques such as cascoding, thus producing a large difference between input and output impedances. The very low (virtual short circuit) input impedance allows a more accurate current summing when the input to the current conveyor forms the summing node.

BRIEF DESCRIPTION OF THE DRAWING

An embodiment of the invention will now be described, by way of example, with reference to the accompanying drawings, in which.

DESCRIPTION OF THE PREFERRED EMBODIMENTS

Figure 1:
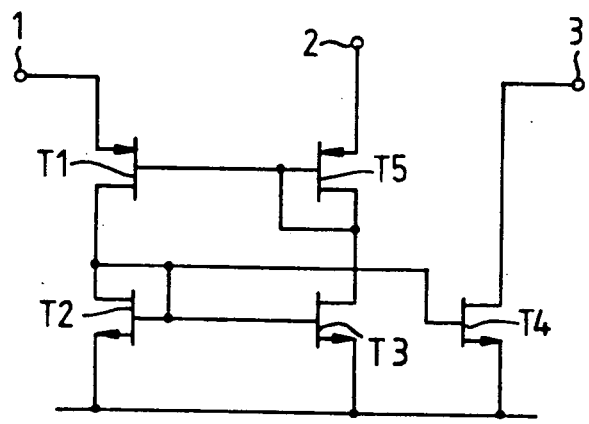
FIG. 1 shows a known first generation current conveyor circuit.

FIG. 1 shows a first generation current conveyor circuit having an input 1 which is the x input and which is connected to the source electrode of a p-channel field effect transistor T1. The drain electrode of transistor T1 is connected to the drain and gate electrodes of an n-channel field effect transistor T2 whose source electrode is connected to ground. The gate electrode of transistor T2 is connected to the gate electrode of two further n-channel field effect transistors T3 and T4 whose source electrodes are connected to ground. The drain electrode of transistor T3 is connected to the drain and gate electrodes of a p-channel field effect transistor T5 whose source electrode is connected to an input 2 which is the y input. The gate electrode of transistor T5 is connected to the gate electrode of transistor T1, i.e. the gate electrodes of transistors T1 and T5 are commoned, while the drain electrode of transistor T4 is connected to an output 3 which is the z output.

In operation, if an input current is applied at input 1 and a bias voltage is applied at terminal 2, an output current will be produced at terminal 3 whose value is proportional to the input current. The proportionality constant is dependent on the dimensions of transistors T2 and T4. The voltage at terminal 1 will be equal to that applied at terminal 2. It will be seen that the input 2 (y input) will draw current and consequently the voltage source connected to input 2 should ideally be able to provide that current without disturbance of the voltage level at input 2 in order to keep the input voltage at the input 1 (x input) constant.

Figure 2:
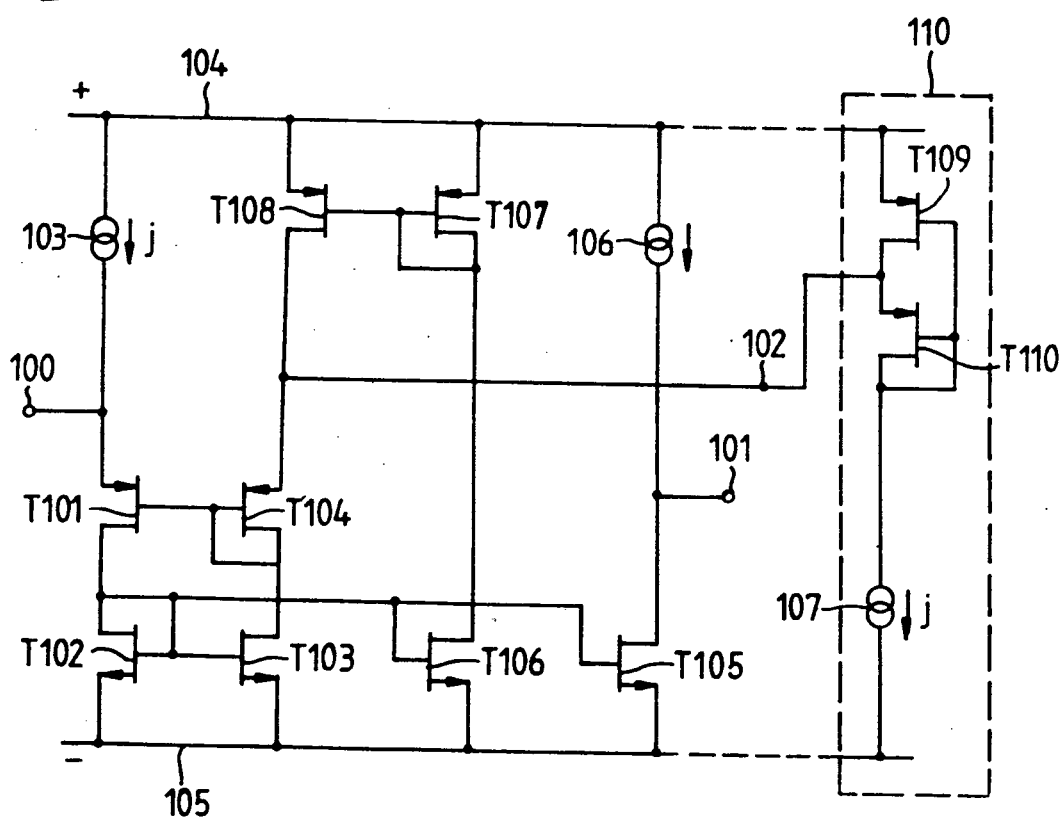
FIG. 2 shows a current conveyor circuit according to the invention.

FIG. 2 shows a current conveyor circuit according to the invention which performs the second generation current conveying function, i.e. its function is defined by the relationship:

$$\begin{pmatrix} i_y \\ v_x \\ i_z \end{pmatrix} = \begin{pmatrix} 0 & 0 & 0 \\ 1 & 0 & 0 \\ 0 & \pm 1 & 0 \end{pmatrix} \begin{pmatrix} v_y \\ i_x \\ v_z \end{pmatrix}$$

The current conveyor circuit shown in FIG. 2 has an input 100 which corresponds to the x input, an output 101 which corresponds to the z output, and a terminal 102 which corresponds to the y input. The input 100 is connected to the junction of a current source 103 and the source electrode of a p-channel field effect transistor T101. The other end of the current source 103 is connected to a positive supply rail 104 while the drain electrode of transistor T101 is connected to a first semiconductor diode means, i.e. to the drain electrode of an n-channel field effect transistor T102. The source electrode of transistor T102 is connected to a negative supply rail 105 while its drain electrode is connected to its gate electrode and to the gate electrode of a further n-channel field effect transistor T103. The source electrode of transistor T103 is connected to the negative supply rail 105 while its drain electrode is connected to a second semiconductor diode means, i.e. to the drain electrode of a p-channel field effect transistor T104 whose source electrode is connected to terminal 102. The gate electrode of transistor T101 is connected to the gate and drain electrodes of transistor T104. Two further n-channel field effect transistors T105 and T106 have their gate electrodes connected to the gate electrode of transistor T102 and their source electrodes connected to the negative supply rail 105. The drain electrode of transistor T105 is connected to the output 101 and via a current source 106 to the positive supply rail 104. The drain electrode of transistor T106 is connected to the drain electrode of a p-channel field effect transistor T107 whose source electrode is connected to the positive supply rail 104. A p-channel field effect transistor T108 has its source electrode connected to the positive supply rail 104, its drain electrode connected to terminal 102 and its gate electrode connected to the gate and drain electrodes of transistor T107. A reference voltage generator 110 comprises a p-channel field effect transistor T109 which has its source electrode connected to the positive supply rail 104 and its drain electrode connected to the source electrode of a p-channel field effect transistor T110. The drain electrode of transistor T110 is connected to the negative supply rail 105 via a current source 107. The gate electrode of transistor T109 is connected to the gate and drain electrodes of transistor T110. The junction of the drain electrode of transistor T109 and the source electrode of transistor T110 is connected to terminal 102 and forms the output of the reference voltage generator 110. The current sources 103, 106 and 107 are arranged to produce a current j which allows an input current i to have the range of approximately ±j without reverse biassing the input diode T102 and a corresponding output current to be produced at output 101.

In operation, if an input current i is applied to input 100 a current of i+j is fed via transistor T101 to the diode connected transistor T102 which together with transistors T103, T05 and T106 forms a multi-output current mirror circuit. In this embodiment the transistors T102, T103, T105 and T106 are constructed with identical geometries and consequently the current j+i is produced at the drain electrodes of each of the transistors. Scaled currents can be produced by appropriately scaling the transistor geometries. The output current produced by transistor T106 (output branch of current mirror T102, T106) is fed to the input branch of a current mirror circuit formed by transistors T107 and T108 causing the current j+i to be fed to terminal 102. This is the current required by the path comprising transistors T103 and T104 and hence no current flows into or out of terminal 102. Transistor T108 forms the output branch of the current mirror circuit, T107, T108. This current mirror circuit provides a means for coupling transistor T106 to terminal 102 and transistor T104.

Transistors T109 and T110 and current source 107 form an arrangement for generating a voltage Vdss below that of the positive supply rail 104 by forming transistor T109 such that its channel/width length ratio is one third of that of transistor T110. This gives a maximum voltage availability to the current conveyor circuit in providing that just sufficient voltage is available to enable the current mirror circuit formed by transistors T107 and T108 to operate and allowing the rest of the voltage range to be available at the input terminal 100. The voltage generating arrangement is not an essential part of the current conveyor circuit and may be replaced by any suitable voltage generating arrangement. The provision of the loop formed by transistors T106, T107 and T108 to provide the current which would otherwise be required from the voltage source coupled to terminal 102 converts this circuit to a second generation current conveyor with input 100 equivalent to the x input, input 102 equivalent to the y input, and output 101 equivalent to the z output.

Further modifications could be made to increase the performance of the current conveyor circuit, if desired. These include the provision of source degeneration resistors to increase the accuracy of current reproduction in compensating for errors in device geometry but at the expense of requiring a greater supply voltage, or dynamic element matching as described for current mirror circuits by Rudy van der Plassche in an article entitled "Dynamic Element Matching puts Trimless Converters on Chip" published in "Electronics" dated June 16, 1983. Also, the current mirror circuit formed by transistors T102, T103, T105 and T106 could be formed from cascoded transistors in order to further increase the output impedance of the current conveyor circuit. In addition, the current conveyor circuit could be formed by bipolar transistors as is shown in the referenced U.S. Pat. No. 3,582,689.

From reading the present disclosure, other modifications will be apparent to persons skilled in the art. Such modifications may involve other features which are already known in the design and use of electrical or electronic circuits and component parts thereof and which may be used instead of or in addition to features already described herein. Although claims have been formulated in this application to particular combinations of features, it should be understood that the scope of the disclosure of the present application also includes any novel feature or any novel combination of features disclosed herein either explicitly or implicitly or any generalisation of one or more of those features which would be obvious to persons skilled in the art, whether or not it relates to the same invention as presently claimed in any claim and whether or not it mitigates any or all of the same technical problems as does the present invention.

I claim:

1. A current conveyor circuit for accepting a current at an input at low impedance and for providing an output current of the same or a related value at an output at high impedance comprising; a first transistor whose main current conducting path is connected between the input and a second diode-connected transistor whose other end is connected to a voltage supply, a third transistor whose main current carrying path is connected between the voltage supply and a fourth diode-connected transistor whose other end is connected to an input terminal for the application of a reference potential, and a fifth transistor whose control electrode is connected to control electrodes of the second and third transistors and whose main current conducting path is connected between the voltage supply and the output, wherein the control electrodes of the first and fourth transistors are commoned, and means coupled to the voltage supply for internally generating a current and for supplying the current to the fourth transistor so that substantially no current is drawn through the input terminal.

2. (thrice amended) A current conveyor circuit as claimed in Claim 1 wherein the means for internally generating a current comprises a sixth transistor whose control electrode is connected to the control electrode of the second transistor, and [which] *wherein the sixth transistor* is connected to *the* means for [feeding] *supplying* the current to the fourth transistor.

3. A current conveyor circuit as claimed in claim 2 wherein the means for feeding the current comprises a current mirror circuit.

4. A current conveyor circuit as claimed in claim 1 wherein the transistors are field effect transistors.

5. A current conveyor circuit comprising:
a low impedance input for receiving an input current,
a high impedance output for supplying an output current proportional to the input current,
a first transistor and a first semiconductor diode means connected in series between said input and a first voltage supply terminal,
an input terminal for applying a reference voltage to the current conveyor circuit,
a second transistor and a second semiconductor diode means connected in series between said first voltage supply terminal and said input terminal,
a third transistor coupled between said first voltage supply terminal and said output and having a control electrode connected to said first semiconductor diode means,
means coupling a control electrode of the first transistor to said second semiconductor diode means, and
transistor means for generating and supplying to the second semiconductor diode means a current of a value such that substantially no current is drawn through the input terminal.

6. A current conveyor circuit as claimed in claim 5 wherein said transistor means comprise:
a fourth transistor coupled to said first semiconductor diode means so as to form therewith a current mirror circuit in which the fourth transistor is the output branch, and
second means coupling said fourth transistor to said second semiconductor diode means and to said input terminal.

7. A current conveyor circuit as claimed in claim 6 wherein said second coupling means comprise a further current mirror circuit having an input branch coupled to the fourth transistor and an output branch coupled to said second semiconductor diode means and to said input terminal.

8. A current conveyor circuit as claimed in claim 5 wherein said first and second semiconductor diode means each comprise a diode-connected transistor and wherein the control electrode of the third transistor is coupled to the control electrode of the second transistor and to the control electrode of the diode-connected transistor of the first semiconductor diode means.

9. A current conveyor circuit as claimed in claim 8 wherein the control electrode of the second transistor is connected in common with the control electrode of the diode-connected transistor of the first semiconductor diode means and the control electrode of the first transistor is connected in common with a control electrode of the diode-connected transistor of the second semiconductor diode means.

10. A current conveyor circuit as claimed in claim 6 further comprising a first current source connected between said low impedance input and a second voltage supply terminal and a second current source connected between said high impedance output and said second voltage supply terminal.

* * * * *

UNITED STATES PATENT AND TRADEMARK OFFICE
CERTIFICATE OF CORRECTION

PATENT NO. : 5,055,719

DATED : October 8, 1991

INVENTOR(S) : JOHN B. HUGHES

It is certified that error appears in the above-identified patent and that said Letters Patent is hereby corrected as shown below:

Abstract:

line 6, after "with" insert --a--;
line 22, change "a" to --. A--.

Claim 2, line 1, delete "(thrice amended)";
        line 5, delete "[which]";
        line 6, delete "[feeding]".

Claim 3, line 2, change "feeding" to --supplying--.

Signed and Sealed this

Fourth Day of August, 1992

Attest:

DOUGLAS B. COMER

*Attesting Officer*    *Acting Commissioner of Patents and Trademarks*